(12) United States Patent
Wasserman

(10) Patent No.: US 11,031,367 B2
(45) Date of Patent: Jun. 8, 2021

(54) BOND HEAD ASSEMBLIES INCLUDING REFLECTIVE OPTICAL ELEMENTS, RELATED BONDING MACHINES, AND RELATED METHODS

(71) Applicant: Kulicke and Soffa Industries, Inc., Fort Washington, PA (US)

(72) Inventor: Matthew B. Wasserman, Philadelphia, PA (US)

(73) Assignee: Kulicke and Soffa Industries, In., Fort Washington, PA (US)

( * ) Notice: Subject to any disclaimer, the term of this patent is extended or adjusted under 35 U.S.C. 154(b) by 35 days.

(21) Appl. No.: 15/789,065

(22) Filed: Oct. 20, 2017

(65) Prior Publication Data
US 2018/0114767 A1 Apr. 26, 2018

Related U.S. Application Data

(60) Provisional application No. 62/412,344, filed on Oct. 25, 2016.

(51) Int. Cl.
*B32B 41/00* (2006.01)
*H01L 23/00* (2006.01)
*H01L 23/544* (2006.01)

(52) U.S. Cl.
CPC ............ *H01L 24/75* (2013.01); *H01L 23/544* (2013.01); *H01L 24/80* (2013.01); *H01L 24/81* (2013.01); *H01L 2223/54426* (2013.01); *H01L 2223/54473* (2013.01); *H01L 2223/54486* (2013.01); *H01L 2224/75305* (2013.01); *H01L 2224/75702* (2013.01); *H01L 2224/75753* (2013.01); *H01L 2224/8013* (2013.01); *H01L 2224/80132* (2013.01); *H01L 2224/8113* (2013.01); *H01L 2224/81132* (2013.01)

(58) Field of Classification Search
CPC ....... H01L 24/75; H01L 23/544; H01L 24/80; H01L 2223/54486; H01L 2223/54473; H01L 2224/81132; H01L 24/81; H01L 2224/8113; H01L 2224/75305; H01L 2223/54426; H01L 2224/8013; H01L 2224/75753; H01L 2224/80132; H01L 2224/75702
USPC .................... 156/64, 350, 351, 378, 379, 60
See application file for complete search history.

(56) References Cited

U.S. PATENT DOCUMENTS 4,037,772 A * 7/1977 Dupuis .................. B23K 20/10
228/1.1
7,527,186 B2 5/2009 Beatson et al.
(Continued)

*Primary Examiner* — Michael N Orlando
*Assistant Examiner* — Joshel Rivera
(74) *Attorney, Agent, or Firm* — Christopher M. Spletzer, Sr.

(57) ABSTRACT

A bond head assembly for a bonding machine is provided. The bond head assembly includes a body portion and a bonding tool for bonding a semiconductor element to a substrate. The bonding tool is secured to the body portion. The bond head assembly also includes at least one reflective optical element carried by the bond head assembly. The at least one reflective optical element is configured to be positioned along an optical path of the bonding machine such that a vision system of the bonding machine is configured to view a portion of the semiconductor element while being carried by the bonding tool prior to bonding of the semiconductor element to the substrate.

20 Claims, 6 Drawing Sheets

(56) References Cited

U.S. PATENT DOCUMENTS

2001/0042770 A1 11/2001 Hayata et al.
2004/0061346 A1* 4/2004 Capewell .......... H01L 21/67144
                                                          294/185

* cited by examiner

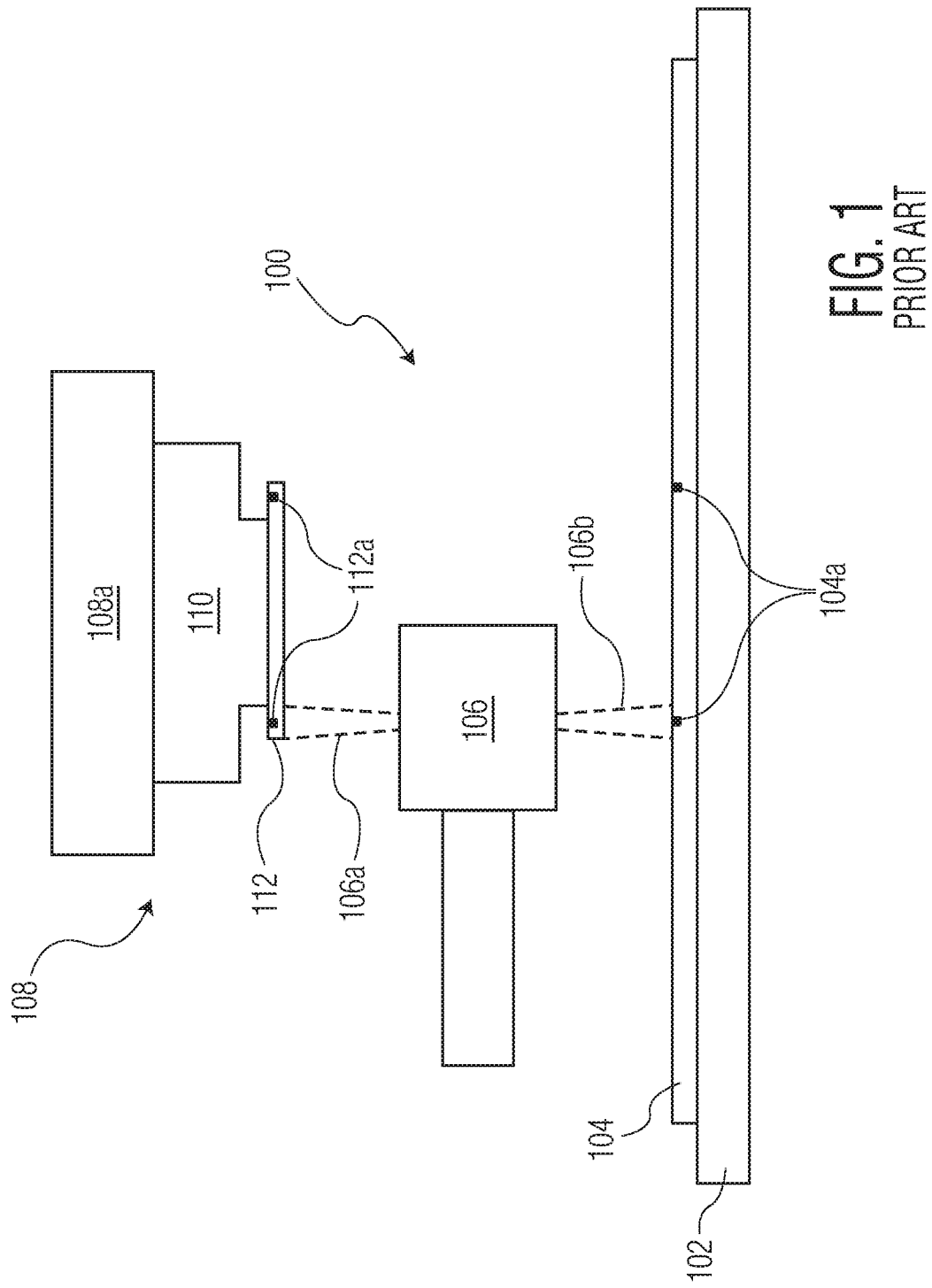

BOND HEAD ASSEMBLIES INCLUDING REFLECTIVE OPTICAL ELEMENTS, RELATED BONDING MACHINES, AND RELATED METHODS

CROSS-REFERENCE TO RELATED APPLICATION

This application claims the benefit of U.S. Provisional Patent Application No. 62/412,344, filed Oct. 25, 2016, the contents of which are incorporated herein by reference.

FIELD

The invention relates to the bond head assemblies for semiconductor element bonding machines, and more particularly, to such bond head assemblies including reflective optical elements such as prism elements.

BACKGROUND

In the semiconductor packaging industry, bonding machines (e.g., die attach machines, thermocompression bonding machines, flip chip bonding machines, etc.) are used to bond a semiconductor element (e.g., a semiconductor die) to a substrate.

In connection with the bonding of the semiconductor element to the substrate, vision systems are typically used for the alignment of the semiconductor element (to be bonded) and the substrate. That is, fiducial markings (or other indicia) on the semiconductor element and/or the substrate may be imaged using the vision system to ensure proper alignment prior to bonding.

In certain applications, the vision system may include a look up/down camera, where the camera is able to view each of the semiconductor element (that is above the vision system) and the substrate (that is below the vision system). FIG. 1 is an example of such a conventional bonding machine.

FIG. 1 is a block diagram illustrating a bonding machine 100 (e.g., a thermocompressive bonding machine). Bonding machine 100 includes a support structure 102 for supporting a substrate 104. As shown in FIG. 1, substrate 104 includes fiducial markings 104a. Bonding machine 100 also includes bond head assembly 108. Bonding tool 110 is included in bond head assembly 108 and is secured to a body portion 108a of bond head assembly 108. Bonding tool 110 carries a semiconductor element 112 (e.g., a semiconductor die 112) configured to be bonded to substrate 104 using bonding tool 110. As shown in FIG. 1, semiconductor 112 includes fiducial markings 112a.

Bonding machine 110 also includes a vision system 106. Vision system 106 includes, for example, a camera and other imaging elements for imaging parts of substrate 104 and semiconductor element 112. Specifically, vision system 106 is a look up/down vision system configured (i) to image a portion of semiconductor 112 using vision path 106a, and (ii) to image a portion of substrate 104 using vision path 106b. As will be appreciated those skilled in the art, vision system 106 desirably images fiducials 104a and 112a for accurate placement of semiconductor element 112 onto substrate 104.

Unfortunately, in certain applications (such as shown in FIG. 1), the fiducial markings on the semiconductor element carried by a bonding tool are not visible using a look up/down camera. Referring again to FIG. 1, fiducials 112a may not be imaged using vision system 106 because they are positioned on a surface of semiconductor element 112 adjacent to bonding tool 110, and not facing vision system 106.

Thus, it would be desirable to provide improved bonding machines for imaging semiconductor elements carried by a bonding tool in a configuration such as shown in FIG. 1.

SUMMARY

According to an exemplary embodiment of the invention, a bond head assembly for a bonding machine is provided. The bond head assembly includes a body portion and a bonding tool for bonding a semiconductor element to a substrate. The bonding tool is secured to the body portion. The bond head assembly also includes at least one reflective optical element carried by the bond head assembly. The at least one reflective optical element is configured to be positioned along an optical path of the bonding machine such that a vision system of the bonding machine is configured to view a portion of the semiconductor element while being carried by the bonding tool prior to bonding of the semiconductor element to the substrate.

According to another exemplary embodiment of the invention, a bonding machine for bonding a semiconductor element to a substrate is provided. The bonding machine includes a support structure for supporting the substrate; a vision system for imaging the semiconductor element; and a bond head assembly as described above.

According to yet another exemplary embodiment of the invention, a method of bonding semiconductor elements is provided. The method comprises the steps of: (i) carrying a semiconductor element with a bonding tool; (ii) providing a bond head assembly, including the bonding tool, carrying at least one reflective optical element; (iii) imaging indicia of the semiconductor element using a vision system of the bonding machine by reflecting light from the vision system to the reflective optical element, from the reflective optical element to the indicia, and from the indicia back to the vision system; (iv) processing at least one image from the vision system; (v) adjusting the relative alignment between the semiconductor element and a substrate after step (iv) using information related to the at least one image processed during step (iv); and (vi) bonding the semiconductor element to the substrate on the bonding machine using the bonding tool.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1 is a block diagram of a conventional bonding machine;

DETAILED DESCRIPTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the terms "substrate" and "workpiece" are intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semiconductor wafer, a BGA substrate, a semiconductor element, etc.

Certain exemplary aspects of the invention relate to a bond head assembly of a bonding machine (e.g., a die attach machine, a thermocompression bonding machine, a flip chip bonding machine, etc.).

Figure 2A:
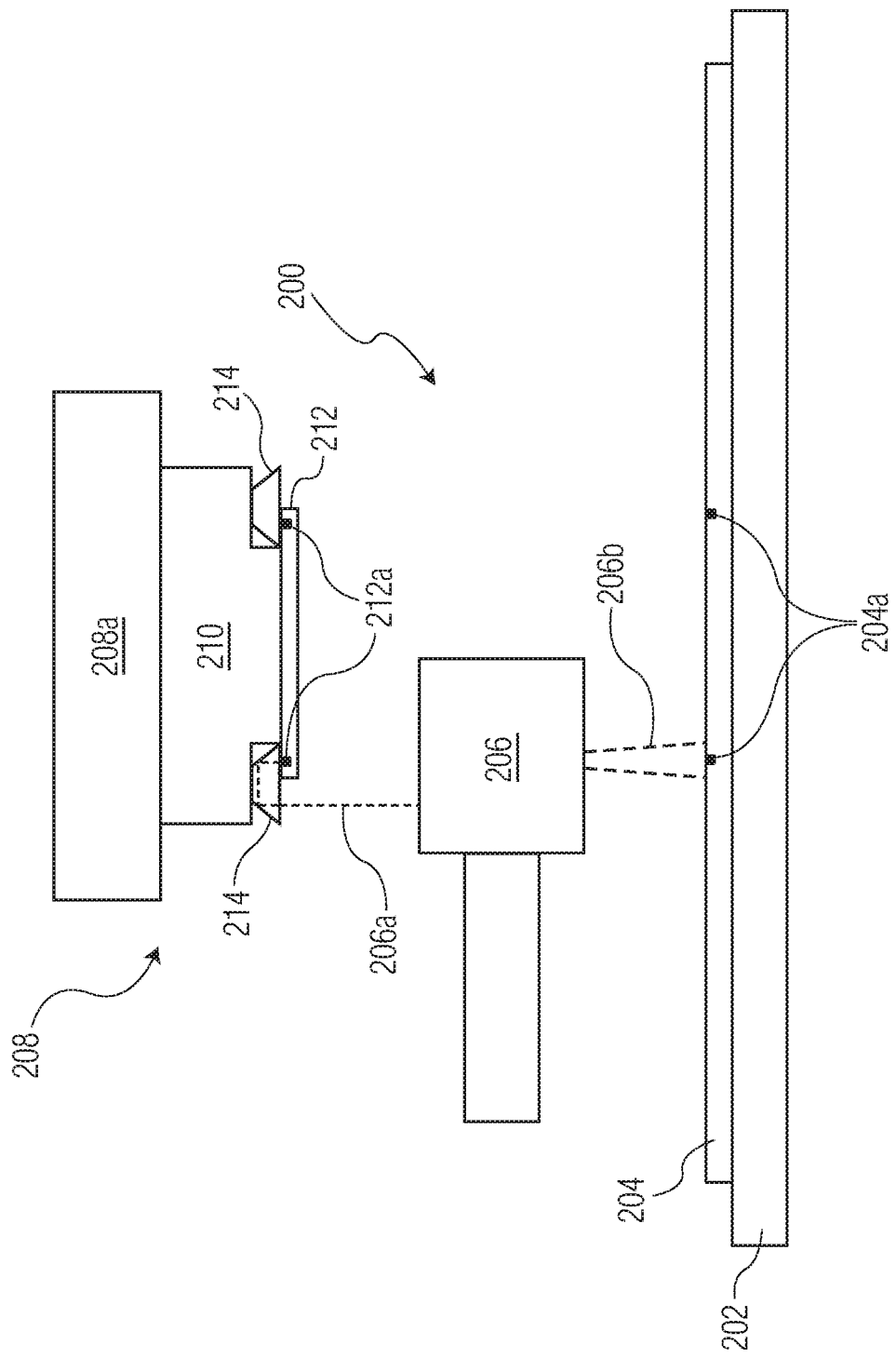
FIGS. 2A-2B are block diagrams of bonding machines in accordance with exemplary embodiments of the invention.
Figure 2B:
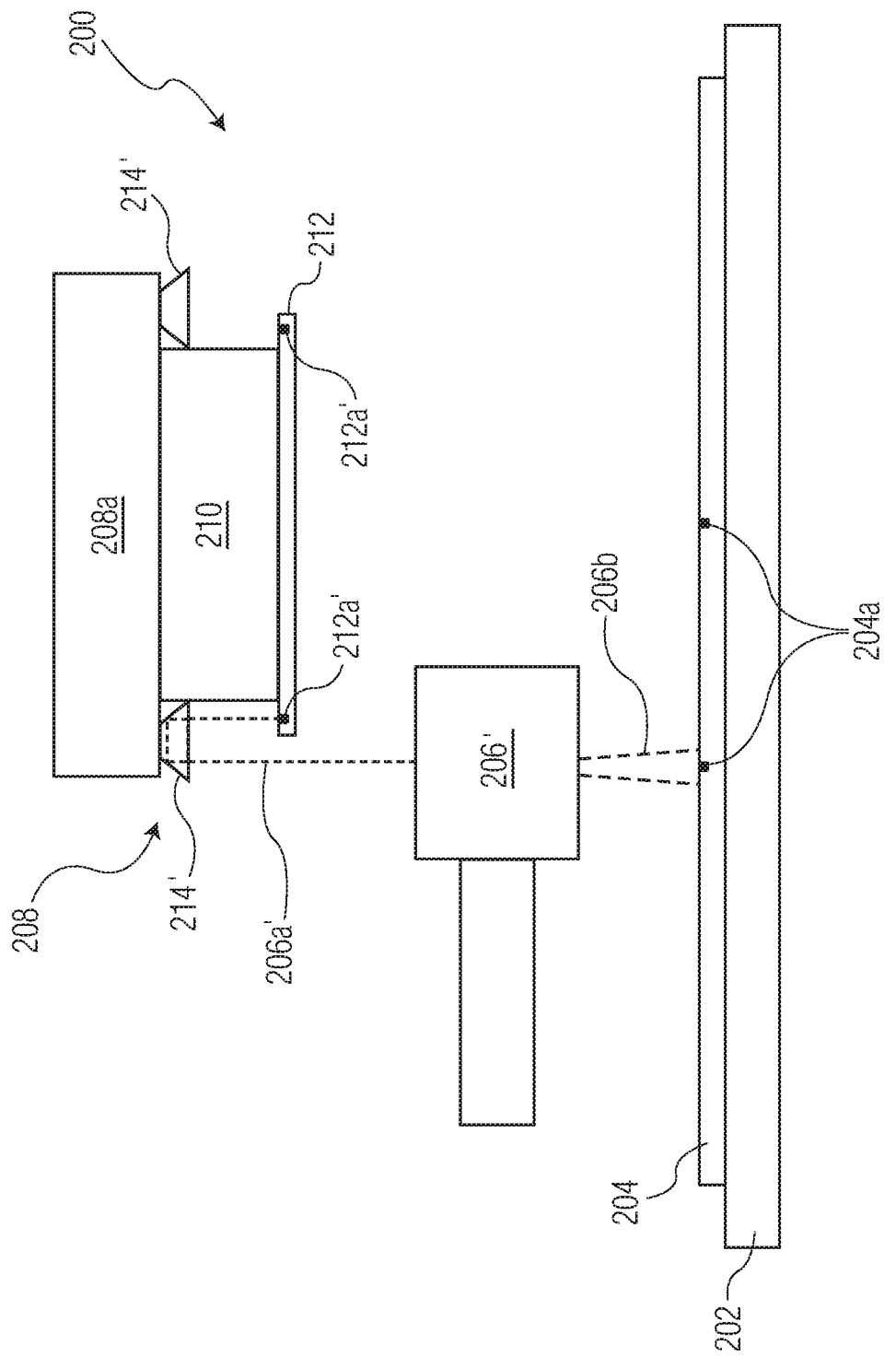

In accordance with certain exemplary embodiments of the invention, the bond head assembly (including a bonding tool) is provided for performing face up, Fan Out Wafer Level Packaging (FOWLP). In such processes, the bonding tool places and attaches a semiconductor element (e.g., a die) to a substrate or wafer. The die being placed is marked with one or more optical fiducials on the upper surface such as shown in FIGS. 2A-2B. The process involves locating the die based on the location of these optical fiducials.

When running a face-up application (such as shown in FIGS. 2A-2B), a bonding machine may be exposed to any error that may occur; for example, when a semiconductor element (e.g., a semiconductor die) is handed over from a transfer tool (e.g., a pick tool for picking the semiconductor element from a source, such as a wafer) to a place tool. Aspects of the invention described herein allow improved final bond placement accuracy, thereby improving the yield of the bonding machine. Aspects of the invention relate to providing an optical path from a vision system (e.g., a split field vision system) to the top side of the die while being held by the place tool.

According to the invention, reflective optical elements (e.g., prism elements such as dove prism elements, multi-prism elements, etc.) are included in the bond head assembly of a bonding machine such that a vision path is provided between a vision system (e.g., a look up camera) and the fiducial (or other indicia) residing on the surface of the semiconductor element facing the bonding tool. FIGS. 2A-2B are examples of such a configuration.

In each of FIGS. 2A-2B like elements are shown with numbers similar to those shown and described above with respect with FIG. 1 For example, in FIG. 1 the substrate is numbered 104, in FIGS. 2A-2B the substrate is numbered 204. It is understood that these elements across the various drawings are the same, or substantially the same.

In FIG. 2A, two reflective optical elements 214 are provided as part of bond head assembly 208 of bonding machine 200. In FIG. 2A these elements are secured to bonding tool 210; however, the reflective optical elements may be carried by another portion of bond head assembly 208. For example, in FIG. 2B, reflective optical elements 214' are carried by a body portion 208a of bond head assembly 208.

In each of FIGS. 2A-2B a vision path 206a, 206a' is provided between the vision system 206, 206' and fiducial marking 212a, 212a'. More specifically, referring to FIG. 2A, light from vision system 206 reflects off of surfaces of reflective optical element 208 until such light images a fiducial marking 212a, and then reflects back to vision system 206 for purposes of determining position information of the semiconductor element 212.

As will be appreciated by those skilled in the art, varying types of reflective optical elements (which may be at least partially transmissive) may be utilized in connection with the invention. One such type of reflective optical element is a prism element. Examples of prism elements include dove prism elements and composite prism elements (e.g., prism elements including multiple prism elements combined together).

Figure 3A:
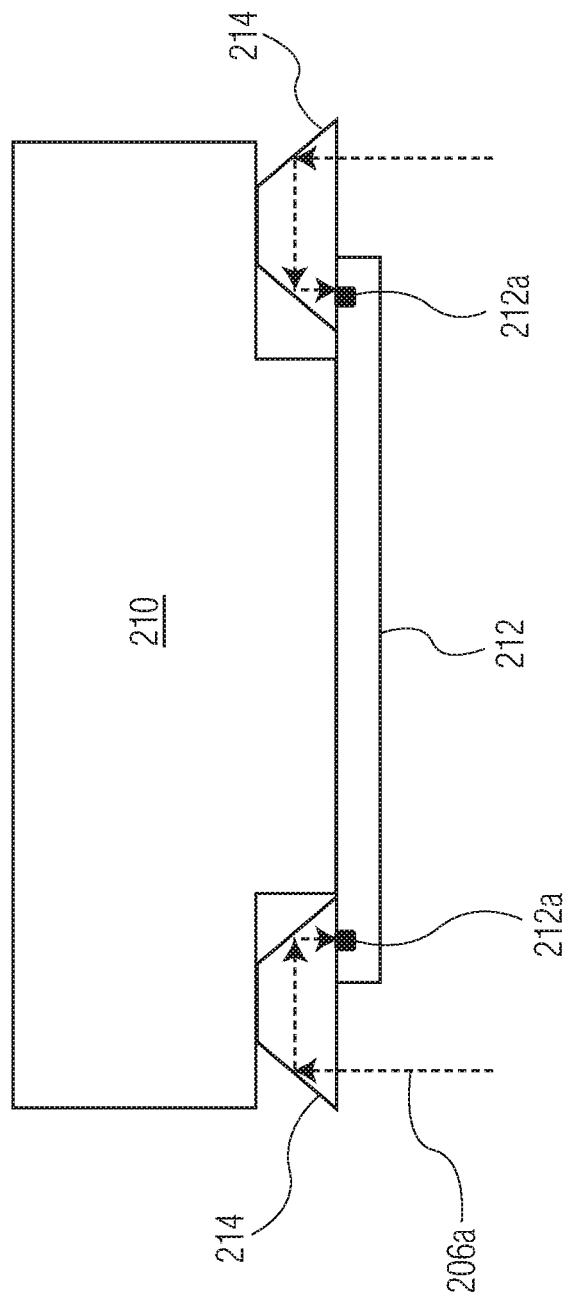
FIGS. 3A-3C are block diagrams of bond head assemblies of bonding machines in accordance with exemplary embodiments of the invention.
Figure 3B:
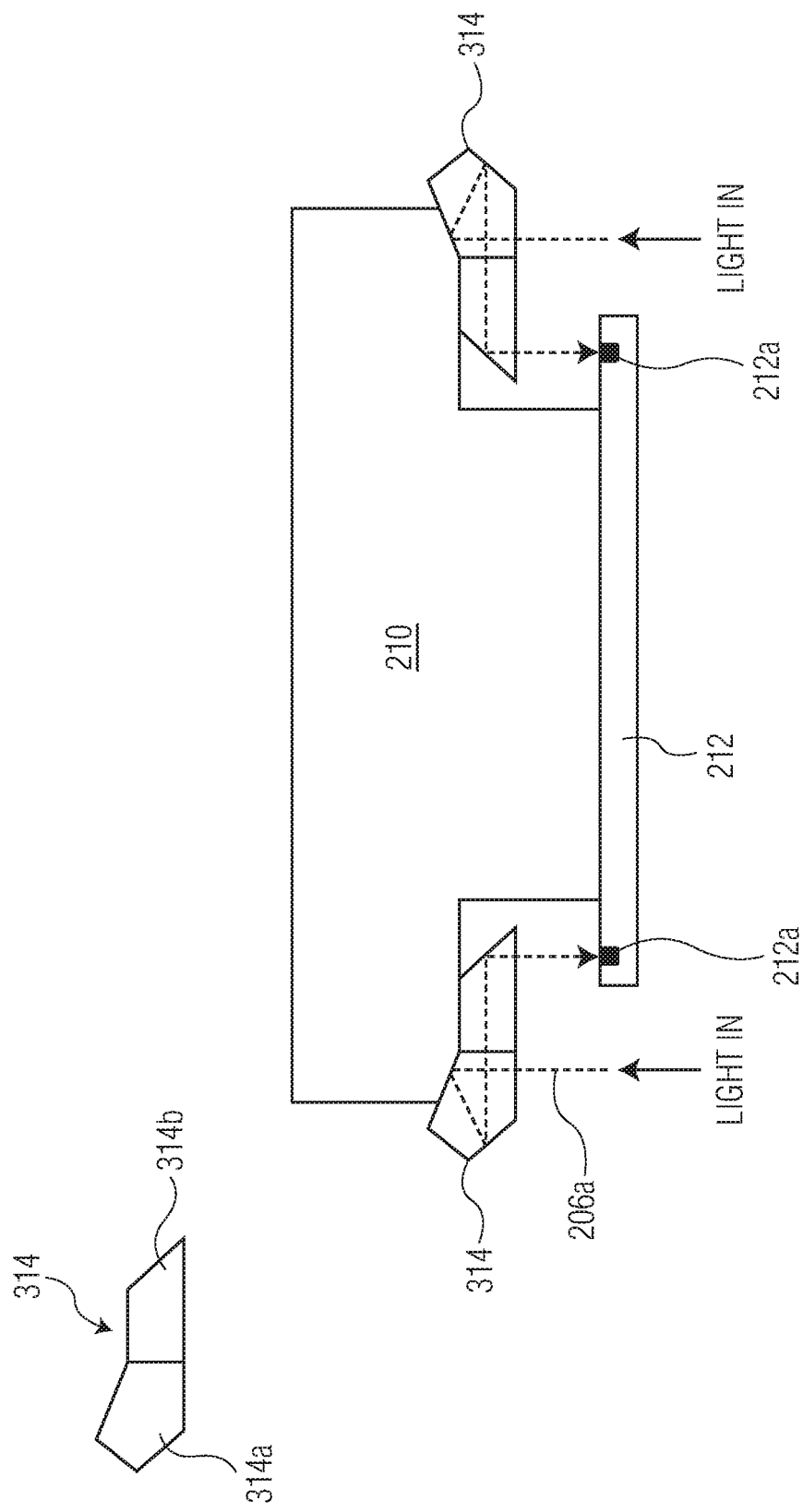
Figure 3C:
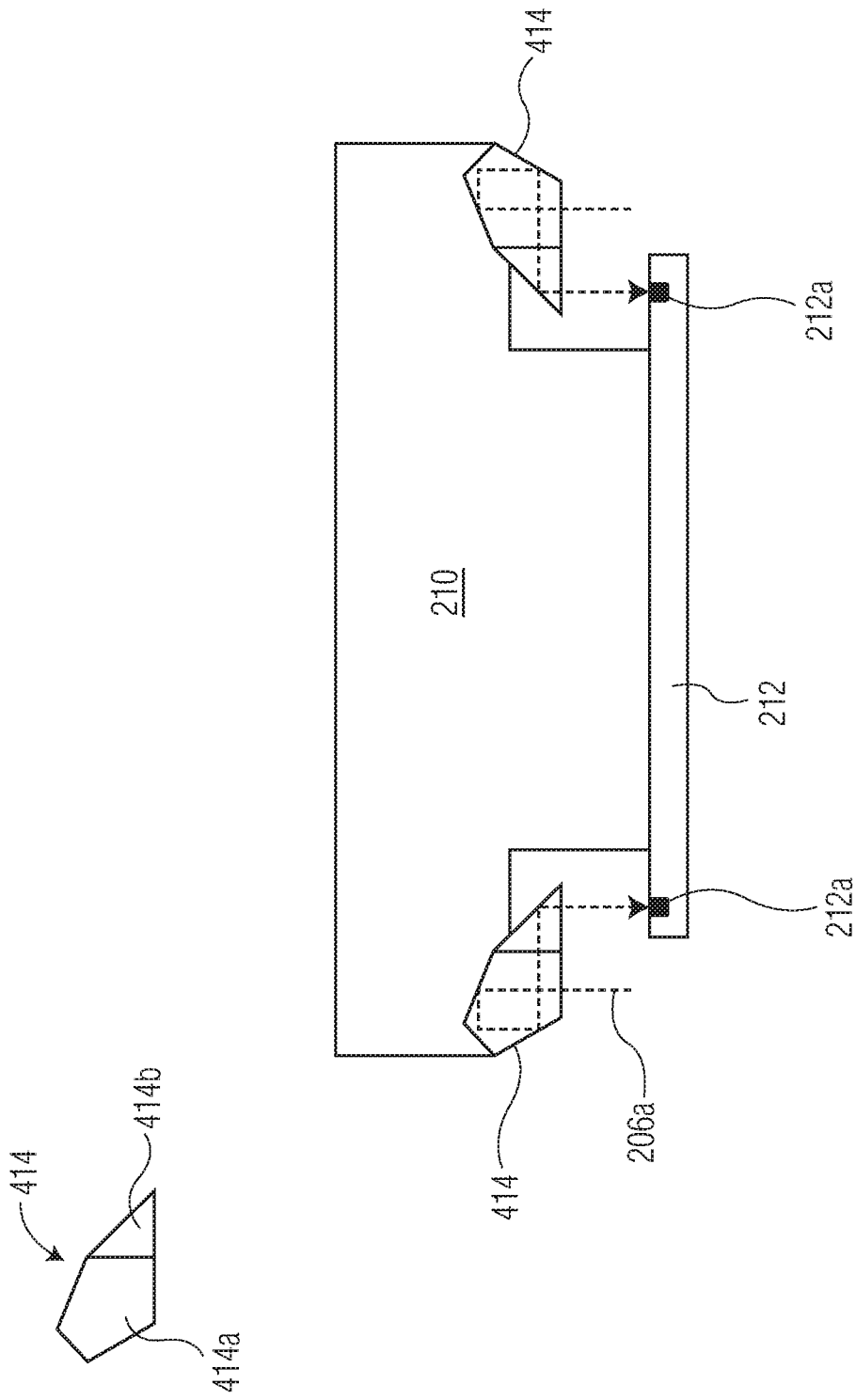

FIG. 3A is an example showing two dove prism elements 214 providing the desired optical paths 206a between the vision system (not shown for simplicity) and the relevant fiducial 212a. FIGS. 3B-3C are examples showing composite prism elements providing the desired optical path. Referring specifically to FIG. 3B, the reflective optical element 314 is a composite prism element including a first portion 314a and a second portion 314b. For example, first portion 314a may be a pentaprism, and second portion 314b may be a right angled prism. Similarly, FIG. 3C illustrates reflective optical element 414 being a composite prism element, including a first portion 414a and a second portion 414b, where the first portion 414a may be a pentaprism, and the second portion 414b may be a right angle prism. In such composite prism elements, the individual portions may be secured to one another, or positioned adjacent one another on the relevant structure (e.g., some portion of the bonding tool or some other support structure of the bond head assembly).

Through the aspects of the invention shown in the drawings, and described above, the reflective optical elements reflect light from the placer vision system to see fiducial markings or other indicia on the face up semiconductor element. The reflective optical elements may be located in opposite corners with respect to one another when carried by the bonding tool (or other portion of the bond head assembly) such that images of both corner fiducial markings can be seen. A glass bond die may be used to learn the offset created by the prisms.

The "prism" tool concept described herein allows the bonding machine to see features on a face up semiconductor element while it is on the place tool (e.g., a bond tool). Face up die could be placed using local alignment or using the same strategy as face down global aligned die.

The present invention may also be embodied as a method of bonding semiconductor elements including steps such as: (i) carrying a semiconductor element with a placer/bond tool, the semiconductor element being carried in a "face up" orientation with the fiducial markings (or other indicia of interest) on the side of the semiconductor element facing (and adjacent) a contact surface of the placer/bond tool; (ii) provide a bond head assembly carrying at least one reflective optical element (either by the bonding tool, or another portion of the bond head assembly) as illustrated and described herein; (iii) imaging indicia of the semiconductor element using a vision system of the bonding machine by reflecting light from the vision system to the reflective optical element, to the relevant fiducial marking or other indicia, and back to the vision system; (iv) processing the images from the vision system, for example, using a computer and image processing software of the bonding machine (or accessible by the bonding machine); and (v) adjusting the relative alignment between the semiconductor element and a substrate after step (iv) using information related to the at least one image; and (vi) bonding the semiconductor element to the substrate on the bonding machine using the bonding tool. Of course, as is understood by those skilled in the art, certain steps described above may be omitted; certain additional steps may be added; and the order of the steps may be altered. Further, the method may include a closed loop process whereby after step (v) steps (iii) and (iv) are repeated until a predetermined level of accuracy of the relative alignment is achieved.

In accordance with exemplary aspects of the invention, one or more reflective optical elements (e.g., prisms, such as described herein) included in the bond head assembly (such as on the bonding tool) may actually make contact with the semiconductor element (e.g., die) to be bonded during the imaging. In a specific example, the reflective optical element (e.g., prism) may define one or more apertures through which vacuum may be pulled. Prior to the imaging of the indicia on the semiconductor element, the semiconductor element may be brought into contact with the reflective optical element (using the vacuum) and the imaging process is performed. Such a technique (and structure) may have particular applicability for small semiconductor elements (e.g., very small die).

Although the invention has described in connection with the use of "reflective" optical elements, it is understood that the entire element may not be reflective, but rather that the element includes at least one reflective surface. As is clear from the drawings (e.g., FIGS. 2A-2B and FIGS. 3A-3C), the various optical elements may have "transmissive" properties, where light transmits through portions of the element, and then are reflected off other surfaces of the element.

Although the invention has been described primarily with respect to face up FOWLP applications, it is not limited thereto. The teachings of the invention may be applicable to various types of applications where imaging of a portion of a semiconductor element facing the bonding tool carrying the element (e.g., a face up orientation) is desirable.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bond head assembly for a bonding machine, the bond head assembly comprising:
   a body portion;
   a bonding tool for bonding a semiconductor element to a substrate, the bonding tool being secured to the body portion; and
   at least one reflective optical element carried by and secured to the bond head assembly, the at least one reflective optical element being configured to be positioned along an optical path of the bonding machine such that a vision system of the bonding machine is configured to view a portion of the semiconductor element while being carried by the bonding tool prior to bonding of the semiconductor element to the substrate.

2. The bond head assembly of claim 1 wherein the at least one reflective optical element is carried by the bonding tool.

3. The bond head assembly of claim 1 wherein the at least one reflective optical element is carried by another portion of the bond head assembly.

4. The bond head assembly of claim 1 wherein the at least one reflective optical element includes a prism element.

5. The bond head assembly of claim 1 wherein the at least one reflective optical element includes a plurality of prism elements arranged as a composite prism element.

6. The bond head assembly of claim 1 wherein the at least one reflective optical element includes at least one of a dove prism, a pentaprism, and a right angled prism.

7. The bond head assembly of claim 1 wherein the portion of the semiconductor element configured to be viewed by the vision system includes a portion of the semiconductor element facing a contact surface of the bonding tool.

8. The bond head assembly of claim 1 wherein the portion of the semiconductor element configured to be viewed by the vision system includes a face up portion of the semiconductor element.

9. A bonding machine for bonding a semiconductor element to a substrate, the bonding machine comprising:
   (a) a support structure for supporting the substrate;
   (b) a vision system for imaging the semiconductor element; and
   (c) a bond head assembly, the bond head assembly including (i) a body portion, (ii) a bonding tool for bonding the semiconductor element to the substrate where the bonding tool is secured to the body portion, and (iii) at least one reflective optical element carried by and secured to the bond head assembly, the at least one reflective optical element being configured to be positioned along an optical path of the bonding machine such that the vision system is configured to view a portion of the semiconductor element while being carried by the bonding tool prior to bonding of the semiconductor element to the substrate.

10. The bonding machine of claim 9 wherein the at least one reflective optical element is carried by the bonding tool.

11. The bonding machine of claim 9 wherein the at least one reflective optical element is carried by another portion of the bond head assembly.

12. The bonding machine of claim 9 wherein the at least one reflective optical element includes a prism element.

13. The bonding machine of claim 9 wherein the at least one reflective optical element includes a plurality of prism elements arranged as a composite prism element.

14. The bonding machine of claim 9 wherein the at least one reflective optical element includes at least one of a dove prism, a pentaprism, and a right angled prism.

15. The bonding machine of claim 9 wherein the portion of the semiconductor element configured to be viewed by the vision system includes a portion of the semiconductor element facing a contact surface of the bonding tool.

16. The bonding machine of claim 9 wherein the portion of the semiconductor element configured to be viewed by the vision system includes a face up portion of the semiconductor element.

17. A method of bonding a semiconductor element, the method comprising the steps of:
   (i) carrying a semiconductor element with a bonding tool;
   (ii) providing a bond head assembly, including the bonding tool, the bond head assembly carrying at least one reflective optical element that is secured to the bond head assembly;
   (iii) imaging indicia of the semiconductor element using a vision system of the bonding machine by reflecting light from the vision system to the reflective optical element, from the reflective optical element to the indicia, and from the indicia back to the vision system;
   (iv) processing at least one image from the vision system;

(v) adjusting a relative alignment between the semiconductor element and a substrate after step (iv) using information related to the at least one image processed during step (iv); and (vi) bonding the semiconductor element to the substrate on the bonding machine using the bonding tool.

18. The method of claim 17 wherein after step (v), steps (iii) and (iv) are repeated until a predetermined level of accuracy of the relative alignment is achieved.

19. The method of claim 17 step (ii) includes the carrying at least one reflective optical element on the bonding tool.

20. The method of claim 17 step (ii) includes carrying at least one reflective optical element on a portion of the bond head assembly distinct from the bonding tool.

* * * * *